(12) United States Patent
Guo et al.

(10) Patent No.: US 12,154,464 B2
(45) Date of Patent: Nov. 26, 2024

(54) DISPLAY MODULE AND TILED DISPLAY DEVICE

(71) Applicants: BOE MLED Technology Co., Ltd., Beijing (CN); BOE Technology Group Co., Ltd., Beijing (CN)

(72) Inventors: Shaofei Guo, Beijing (CN); Shipeng Wang, Beijing (CN); Zhonghua Li, Beijing (CN); Yiping Ruan, Beijing (CN)

(73) Assignees: BOE MLED Technology Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 509 days.

(21) Appl. No.: 17/504,531

(22) Filed: Oct. 19, 2021

(65) Prior Publication Data
US 2022/0284836 A1 Sep. 8, 2022

(30) Foreign Application Priority Data
Mar. 5, 2021 (CN) .......................... 202110244367.8

(51) Int. Cl.
G09F 9/302 (2006.01)
G09F 9/33 (2006.01)
G09G 3/32 (2016.01)
H01L 33/62 (2010.01)
H01L 33/64 (2010.01)

(52) U.S. Cl.
CPC .............. *G09F 9/3026* (2013.01); *G09F 9/33* (2013.01); *G09G 3/32* (2013.01); *H01L 33/62* (2013.01); *H01L 33/642* (2013.01); *H01L 33/648* (2013.01)

(58) Field of Classification Search
CPC .......... G09F 9/3026; G09F 9/33; G09G 3/32; H01L 33/62; H01L 33/648; H01L 33/642
See application file for complete search history.

(56) References Cited

U.S. PATENT DOCUMENTS

2008/0122832 A1* 5/2008 Chen ........................ G09G 3/32
345/55
2011/0261286 A1* 10/2011 Choi ................. G02F 1/133611
349/61
2020/0184880 A1* 6/2020 Jung ..................... H01L 25/167

* cited by examiner

Primary Examiner — Abbas I Abdulselam
(74) Attorney, Agent, or Firm — Ling Wu; Stephen Yang; Ling and Yang Intellectual Property

(57) ABSTRACT

A display module and a tiled display device are provided. The display module includes a driving backboard and a heat dissipation component, wherein the driving backboard includes an underlaying substrate and a driving circuit disposed on the underlaying substrate, the underlaying substrate is provided with a flexible printed circuit board connected with the driving circuit, and the heat dissipation component is provided with an adapter component connected with the flexible printed circuit board, and the adapter component includes a pluggable connector.

19 Claims, 3 Drawing Sheets

DISPLAY MODULE AND TILED DISPLAY DEVICE

CROSS-REFERENCE TO RELATED APPLICATION

The present application claims priority of Chinese Patent Application No. 202110244367.8 filed to the CNIPA on Mar. 5, 2021, the content of which is incorporated herein by reference.

TECHNICAL FIELD

Embodiments of the present disclosure relate to, but are not limited to the field of display technologies, specifically to a display module and a tiled display device.

BACKGROUND

Due to advantages such as simple structure, small size, energy saving, high efficiency, long service life and clear light, in recent years, light emitting diodes (LEDs) have gradually replaced conventional lightings such as incandescent lamps and fluorescent lamps, and are becoming a mainstream product in the new generation lighting market, and are also widely applied in photoelectric systems.

With a rise of Mini LED industry, how to improve module performance has become a goal pursued by many people. According to different forms of modules, Mini LEDs may be divided into two technical implementation forms: back light and display module.

Compared with Micro LEDs, Mini LEDs have lower technical difficulty, which makes them easier for mass production, and have better product economy. The price of the liquid crystal display device using a Mini LED backlight module is only 60-80% of that of an OLED display device, and the brightness and image quality of the liquid crystal display device are similar to those of the OLED display device. The liquid crystal display device saves electricity and has higher efficiency, making the Mini LED a highly competitive product in the current market.

Small-pitch LED displays have been widely used in many fields for their advantages such as high brightness, low working voltage, low power consumption, long service life, shock resistance and stable performance. The mini-LED may be applied to large-size ultra-small pitch displays. Compared with an LCD display, a small-pitch LED display has the advantages of seamless, high brightness and no reflection image.

A small-pitch LED display uses a PCB substrate as an LED carrier, wherein a driving circuit is provided on a front side of the PCB substrate and a driving component is mounted on a back side of the PCB substrate. This solution has certain advantages in large-size display products, but it is not suitable for small-size display products.

SUMMARY

The following is a summary of the subject matters described in the present disclosure in detail. The summary is not intended to limit the scope of protection of the claims.

In a first aspect, an embodiment of the present disclosure provides a display module, including a driving backboard and a heat dissipation component, wherein the driving backboard includes an underlaying substrate and a driving circuit disposed on the underlaying substrate, the underlaying substrate is provided with a flexible printed circuit board connected with the driving circuit, and the heat dissipation component is provided with an adapter component connected with the flexible printed circuit board, and the adapter component includes a pluggable connector.

In an exemplary embodiment, the adapter component further includes an adapter circuit board, and the connector is disposed on the adapter circuit board and is connected with the flexible printed circuit board through the adapter circuit board.

In an exemplary embodiment, the adapter circuit board is disposed on a side of the heat dissipation component away from the driving backboard, and the connector is disposed on a side of the adapter circuit board away from the heat dissipation component.

In an exemplary embodiment, the flexible printed circuit board is disposed on a side of the underlaying substrate away from the driving circuit.

In an exemplary embodiment, a side edge of the underlaying substrate is provided with a signal lead connecting the flexible printed circuit board with the driving circuit.

In an exemplary embodiment, the underlaying substrate is a glass substrate.

In an exemplary embodiment, the heat dissipation component includes a heat dissipation plate, a heat dissipation channel provided on the heat dissipation plate, and coolant accommodated in the heat dissipation channel, wherein the coolant is configured to dissipate heat from the driving backboard.

In an exemplary embodiment, the heat dissipation channel is a closed channel.

In an exemplary embodiment, the heat dissipation plate is at least partially in contact with the driving backboard.

In an exemplary embodiment, the heat dissipation channel includes a main heat dissipation channel and sub heat dissipation channels disposed crosswise on at least one side of the main heat dissipation channel, wherein the sub heat dissipation channels are communicated with the main heat dissipation channel.

In an exemplary embodiment, the heat dissipation component is bonded with the driving backboard.

In an exemplary embodiment, a light emitting unit connected with the driving backboard is further included.

In the second aspect, an embodiment of the present disclosure provides a tiled display device, which includes a housing and at least one of the aforementioned display module disposed on the housing, wherein the housing is provided with a signal joint, wherein the connector in the display module is plugged with the signal joint.

In an exemplary embodiment, the display module is magnetically connected with the housing.

Of course, an implementation of any product or method in the embodiments of the present disclosure does not need to achieve all the advantages mentioned above at the same time. Other features and advantages of the present disclosure will be set forth in the following embodiments of the description, and in part will become apparent from the embodiments of the description, or be learned by practice of the present disclosure. Purposes and other advantages of the technical solutions of the present disclosure may be achieved and acquired by structures specified in the detailed description, claims and drawings.

Other aspects may be comprehended upon reading and understanding of the drawings and the detailed descriptions.

BRIEF DESCRIPTION OF DRAWINGS

The drawings provide a further understanding of technical solutions of the present disclosure, form a part of the specification, and are used to explain, together with the embodiments of the present disclosure, the technical solutions of the present disclosure and not intended to form limitations on the technical solutions of the present disclosure. The shape and size of each component in the drawings do not reflect true scales and only to be used to schematically illustrate contents of the present disclosure.

DETAILED DESCRIPTION

Specific implementations of the present disclosure will be described further in detail below with reference to the accompanying drawings and embodiments. The following embodiments serve to illustrate the present disclosure, but are not intended to limit the scope of the present disclosure. The embodiments and features in the embodiments in the present disclosure may be combined randomly if there is no conflict.

An embodiment of the disclosure provides a display module, including a driving backboard and a heat dissipation component, wherein the driving backboard includes an underlaying substrate and a driving circuit disposed on the underlaying substrate. The underlaying substrate is provided with a flexible printed circuit board connected with the driving circuit, and the heat dissipation component is provided with an adapter component connected with the flexible printed circuit board, wherein the adapter component includes a pluggable connector.

According to the embodiment of the present disclosure, the display module achieves its plug-in display through the connector, so that the display module can achieve the splicing and assembling of the display module by plugging.

Figure 1:
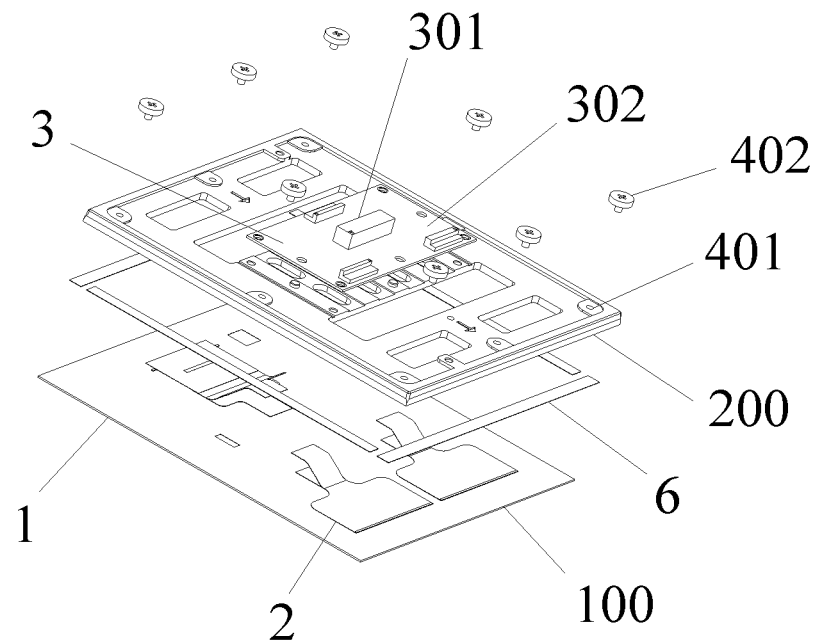
FIG. 1 is an exploded view of a display module according to an embodiment of the present disclosure.
Figure 2:
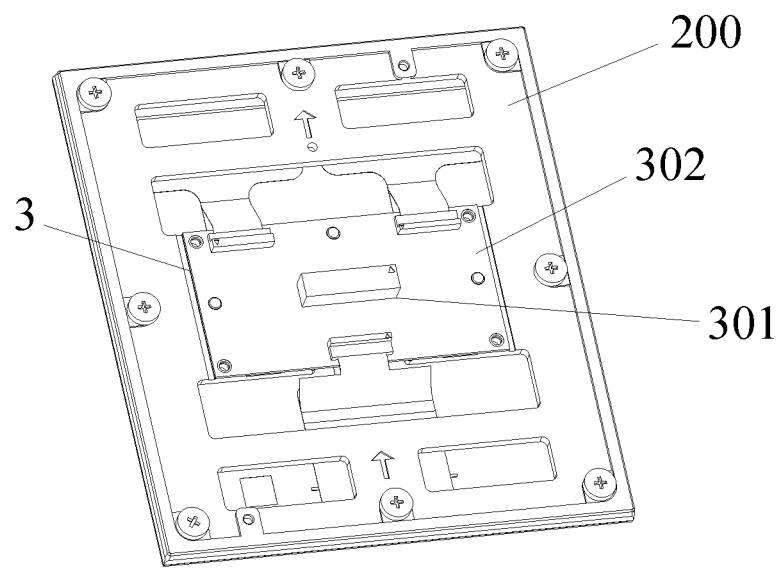
FIG. 2 is a schematic diagram of a structure of a display module according to an embodiment of the present disclosure.

FIG. 1 is an exploded view of a display module according to an embodiment of the present disclosure. FIG. 2 is a schematic diagram of a structure of a display module according to an embodiment of the present disclosure. As shown in FIG. 1 and FIG. 2, the display module of the embodiment of the present disclosure includes a driving backboard 100 and a heat dissipation component 200. The heat dissipation component 200 is configured to dissipate heat from the driving backboard 100. The driving backboard 100 includes an underlaying substrate 1 and a driving circuit (not shown in the figures) disposed on the underlaying substrate 1. The underlaying substrate 1 is provided with a flexible printed circuit board 2 connected with the driving circuit, and the heat dissipation component 200 is provided with an adapter component 3. The adapter component 3 is connected with the flexible printed circuit board 2. The adapter component 3 includes a pluggable connector 301, wherein the pluggable connector 301 is configured to input a control signal into the driving circuit through the flexible printed circuit board 2. According to the embodiment of the present disclosure, the display module 301 achieves its plug-in display through the connector 301, so that the display module can achieve the splicing and assembling of the display module by plugging.

In an exemplary embodiment, the adapter component 3 further includes an adapter circuit board 302, and the connector 301 is disposed on the adapter circuit board 302 and is connected with the flexible printed circuit board 2 through the adapter circuit board 302. The adapter circuit board 302 may be a three-in-one adapter board, and one side of the adapter circuit board 302 is connected with the flexible printed circuit board 2 to achieve signal communication between the adapter circuit board 302 and the flexible printed circuit board 2. The other side of the adapter circuit board 302 is provided with a connector 301, wherein the connector 301 is connected with the flexible printed circuit board 2 through a connection lead on the adapter circuit board 302, so that the control signal of the connector 301 can be transmitted to the driving circuit through the flexible printed circuit board 2, thereby providing the control signal for the driving circuit.

In an exemplary embodiment, the adapter circuit board 302 is disposed on a side of the heat dissipation component 200 away from the driving backboard 100, and the connector 301 is disposed on a side of the adapter circuit board 302 away from the heat dissipation component 200, so that after the display module is plugged in a housing through the connector 301, a light emitting side of the display module faces the outside of the housing, which is convenient for splicing and assembling the display module.

In an exemplary embodiment, the display module of the embodiment of the present disclosure further includes a light emitting unit (not shown in the figures), which is disposed on the driving backboard and is connected with the driving circuit. The driving circuit can drive the light emitting unit to emit light. The light emitting unit may be a micro light emitting diode.

In an exemplary embodiment, the light emitting unit may be formed on the driving backboard in various ways. For example, the light emitting unit may be mounted on the driving backboard by using a roll-to-flat printer or chip bonding device. When mounting the light emitting unit on the driving backboard, it is required that the bonding pad of the light emitting unit itself and the bonding pad for mounting the light emitting unit on the driving backboard both have good adhesiveness.

In an exemplary embodiment, the underlaying substrate 1 is a glass substrate. The glass substrate has high flatness. When the driving circuit is manufactured on a glass substrate, an active driving solution can be achieved, thereby reducing the entire volume of the driving backboard and better reducing the power consumption of the driving backboard. Moreover, the driving backboard made of glass substrate has better water resistance and oxygen corrosion resistance, which is more conducive to improving the service life and reliability of the driving backboard.

In an exemplary embodiment, the flexible printed circuit board 2 is disposed on a side of the underlaying substrate 1 away from the driving circuit, so that after the driving backboard 100 and the heat dissipation component 200 are mounted, the flexible printed circuit board 2 is located on a side of the driving backboard 100 close to the heat dissipation component 200, which facilitates the connection between the flexible printed circuit board 2 and the adapter component 3 on the heat dissipation component 200.

In an exemplary embodiment, a side edge of the underlaying substrate 1 is provided with signal leads (not shown in the figures) connecting the flexible printed circuit board 2 and the driving circuit. The signal leads are wired on the side edge of the underlaying substrate 1 to connect the driving circuit located on one side surface of the underlaying substrate 1 with the flexible printed circuit board 2 located on the other side of the underlaying substrate 1. In this way, formation of vias with a high density on the underlaying substrate 1 can be avoided.

In an exemplary embodiment, the driving circuit in the display module of the embodiment of the present disclosure includes a thin film transistor array layer disposed on the underlaying substrate 1, and the signal leads are configured to provide control signals for the thin film transistor array layer, so that an output electrode of each thin film transistor included in the thin film transistor array layer outputs a driving signal.

In an exemplary embodiment, the thin film transistor array layer may include a light shielding layer, an active layer, a gate insulating layer, a gate electrode, a dielectric layer, a source electrode, a drain electrode, a planarization layer and an anode. The active layer, the gate insulating layer, the gate electrode, the dielectric layer, the source electrode and the drain electrode form a thin film transistor, and the source electrode or the drain electrode may be used as an output electrode of the thin film transistor, which is connected with the anode through a via formed on the planarization layer, and the anode may be used as one of the pads for mounting the light emitting unit subsequently. The thin film transistor array layer may further include a common electrode, which may be used as another pad for mounting the light emitting unit. When manufacturing the thin film transistor array layer, it is necessary to reserve pads with enough heights and sizes for the subsequent mounting of the light emitting unit.

When manufacturing the thin film transistor array layer with the above structure, the signal leads may be configured to transmit the control signal input from the connector 301 into the thin film transistor array layer. When the signal leads are connected with the gate electrodes included in the thin film transistor array layer, the connector 301 is configured to provide scanning signals for the gate electrodes, and when the signal leads are connected with the source electrodes or drain electrodes included in the thin film transistor array layer that do not serve as output electrodes, the connector 301 is configured to provide data signals for the source electrodes or drain electrodes.

Figure 3:
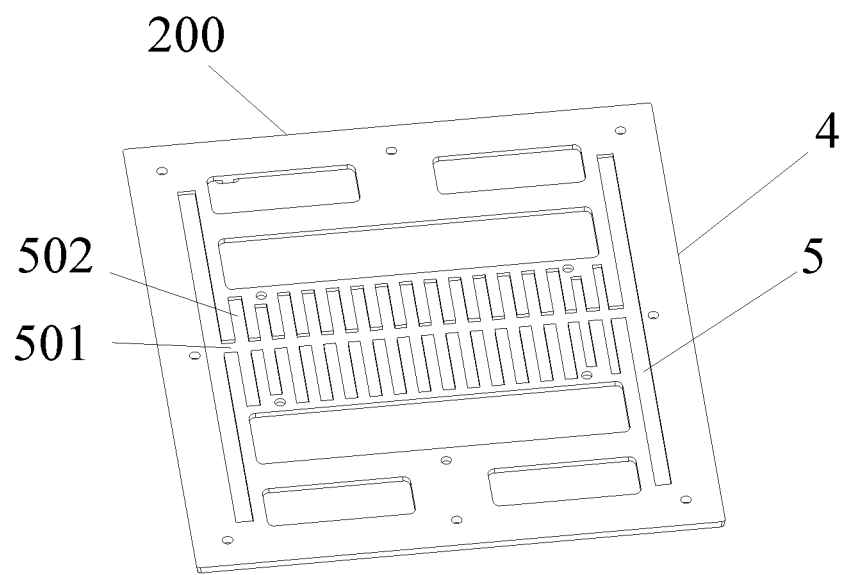
FIG. 3 is a schematic diagram of a structure of a heat dissipation component in a display module according to an embodiment of the present disclosure.
Figure 4:
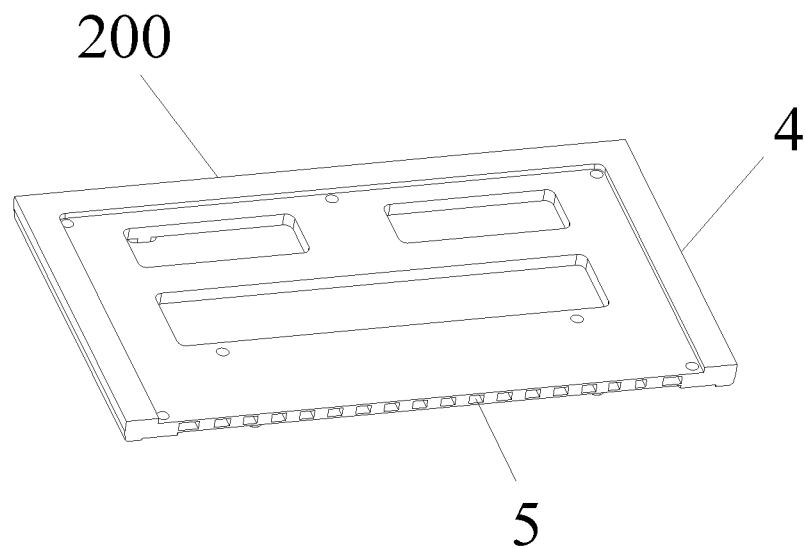
FIG. 4 is a sectional view of a heat dissipation component in a display module according to an embodiment of the present disclosure.

FIG. 3 is a schematic diagram of a structure of a heat dissipation component in a display module according to an embodiment of the present disclosure. FIG. 4 is a sectional view of a heat dissipation component in a display module according to an embodiment of the present disclosure. In an exemplary embodiment, as shown in FIGS. 3 and 4, the heat dissipation component 200 includes a heat dissipation frame 4, a heat dissipation channel 5 disposed on the heat dissipation frame 4, and coolant accommodated in the heat dissipation channel 5, wherein the coolant is used for dissipating heat from the driving backboard 100. The heat dissipation frame 4 may have a metal frame die-casting structure, for example, an aluminum frame die-casting structure.

When the temperature of the driving backboard 100 is too high in the embodiment of the present disclosure, the heat generated by the driving backboard 100 is transferred to the coolant in the heat dissipation component 200, so that the coolant is vaporized, and the heat is quickly absorbed to achieve the heat dissipation of the driving backboard 100. When the temperature of the driving backboard 100 in the embodiment of the present disclosure is normal, the coolant in the heat dissipation component 200 is liquefied when it is cooled.

According to the embodiment of the present disclosure, use of the aforementioned heat dissipation solution can greatly improve the display brightness of the display module on the basis of not increasing power consumption or circuit complexity, and the brightness may be improved to over 2000 nit.

In an exemplary embodiment, the heat dissipation channel 5 is a closed channel. When the temperature of the driving backboard 100 is too high in the embodiment of the present disclosure, the coolant is evaporated in vacuum in the heat dissipation channel 5, which quickly absorbs the heat of the driving backboard 100, thereby reducing the temperature of the driving backboard 100 and achieving heat dissipation of the driving backboard 100.

In the exemplary embodiment, the heat dissipation channel 5 is connected with the heat dissipation frame 4 as a whole. In an exemplary embodiment, a closed heat dissipation pipe is formed on one side surface of the heat dissipation frame 4, and a closed channel inside the heat dissipation pipe forms the heat dissipation channel 5.

In an exemplary embodiment, the heat dissipation frame 4 is at least partially in contact with the driving backboard 100. When the temperature of the driving backboard 100 is too high, the heat generated by the driving backboard 100 is transferred to the heat dissipation frame 4, which transfers the heat to the coolant, which vaporizes and quickly absorbs the heat, thus achieving the heat dissipation of the driving backboard 100 and improving the heat dissipation effect of the heat dissipation component 200.

In an exemplary embodiment, the heat dissipation channel 5 includes a main heat dissipation channel 501 and sub-heat dissipation channels 502 disposed crosswise on at least one side of the main heat dissipation channel 501. The sub-heat dissipation channels 502 communicate with the main heat dissipation channel 501 to increase the contact area between the heat dissipation channel 5 and the heat dissipation frame 4, so that the coolant in the heat dissipation channel 5 can quickly absorb the heat of the heat dissipation frame 4 and improve the heat dissipation effect of the heat dissipation component 200.

In an exemplary embodiment, as shown in FIG. 1, the heat dissipation component 200 is bonded to the driving backboard 100. In an exemplary embodiment, one side of the underlaying substrate 1 in the driving backboard 100 close to the heat dissipation component 200 is provided with a positioning mark, through which the heat dissipation frame 4 in the heat dissipation component 200 is aligned with the underlaying substrate 1 in the driving backboard 100, and then the heat dissipation frame 4 and the underlaying substrate 1 are bonded together by adhesive tape 6 by machine bonding.

Figure 5:
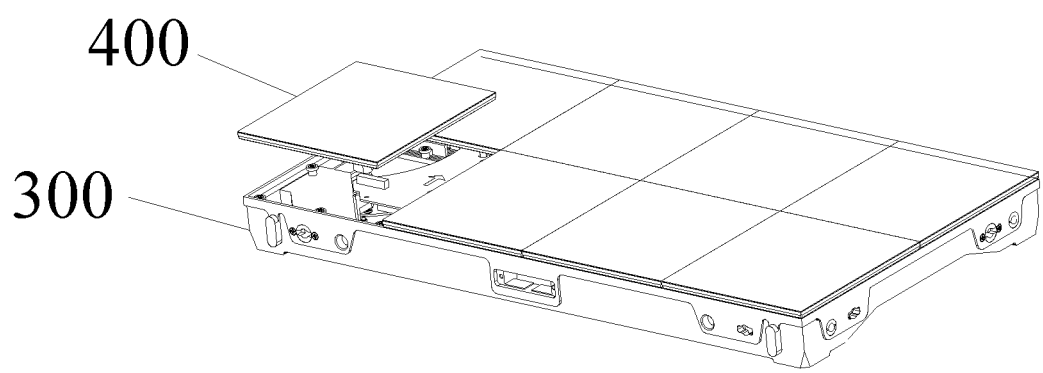
FIG. 5 is a schematic diagram of a structure a tiled display device according to an embodiment of the present disclosure.

FIG. 5 is a schematic diagram of a structure a tiled display device according to an embodiment of the present disclosure. As shown in FIG. 5, an embodiment of the present disclosure further provides a tiled display device, which includes a housing 300 and at least one of the above-mentioned display modules 400 disposed on the housing 300. The housing 300 is provided thereon with a signal joint, and a connector 301 in the display module 400 is plugged in the signal joint to achieve signal communication between the display module 400 and the housing 300, so that a control signal provided by a driving component in the housing 300 may be input into a driving backboard in the display module 400 through the signal joint and the connector 301, thereby achieving splicing and assembling of the display module 400.

In an exemplary embodiment, at least two display modules 400 are disposed on the housing 300, and the at least two display modules 400 are disposed in an array on the housing 300. One side of the housing 300 is provided with an installation cavity, and an opening is formed by the installation cavity on one side of the housing 300. After at least two display modules 400 are mounted in the installation cavity of the housing 300, and a tiled display screen is formed at the opening on the one side of the housing 300.

In an exemplary embodiment, the connector 301 is located on one side of the display modules 400 away from the light emitting side of the display modules 400. When the display modules 400 are tiled and assembled, the side of the display modules 400 away from the light emitting side of the display modules 400 is inserted into the housing 300, and the connector 301 is plugged in the signal joint in the box 300. In this way, the splicing and assembling of the display modules 400 are achieved. After the display modules 400 are inserted into the housing 300, the light emitting side of the display module 400 faces the outside of the housing 300.

In an exemplary embodiment, the display modules 400 are magnetically connected with the housing 300. In an exemplary embodiment, as shown in FIG. 1, multiple mounting holes 401 are disposed at the periphery of the heat dissipation frame 4 in the display modules 400, and magnetic screws 402 are disposed in the mounting holes 401, wherein the magnetic screws 402 are located on a side of the heat dissipation frame 4 close to the housing 300. The housing 300 may be made of metal or provided with magnetic parts. When the display modules 400 are mounted in the housing 300, the magnetic screws 402 are magnetically connected with the housing 300 or the magnetic parts in the housing 300 to fix the display modules 400 with the housing 300, thus facilitating the mounting and disassembly of the display modules 400 with the housing 300.

In the description of the present disclosure, it should be understood that an orientation or positional relation indicated by the terms "middle", "upper", "lower", "front", "rear", "vertical", "horizontal", "top", "bottom", "inner", "outer" and the like is based on the orientation or positional relation shown in the accompanying drawings, which is only for the convenience of describing the present disclosure and simplifying the description, rather than indicating or implying that the device or element referred to must have the specific orientation, or be constructed and operated in the specific orientation, and thus cannot be interpreted as a limitation on the present disclosure.

In the description of the embodiment of the present disclosure, it should be noted that unless otherwise specified and limited, the terms "mount", "connected" and "connect" should be understood in a broad sense. For example, a connection may be fixed connection, detachable connection or integrated connection, may be mechanical connection or electrical connection, or may be direct connection, indirect connection through intermediate medium, or communication inside two components. Those of ordinary skills in the art may understand the meanings of the terms in the present disclosure according to specific situations.

Although the embodiments disclosed in the present disclosure are as described above, the contents described are only the embodiments used to facilitate the understanding of the present disclosure, and are not intended to limit the present disclosure. Those skilled in the art may make any modifications and variations to implementation forms and details without departing from the spirit and scope disclosed by the present disclosure. However, the patent protection scope of the present disclosure should also be subject to the scope defined by the appended claims.

What is claimed is:

1. A display module, comprising a driving backboard and a heat dissipation component, wherein the driving backboard comprises an underlaying substrate and a driving circuit disposed on the underlaying substrate, the underlaying substrate is provided with a flexible printed circuit board connected with the driving circuit, and the heat dissipation component is provided with an adapter component connected with the flexible printed circuit board, and the adapter component comprises a pluggable connector.

2. The display module according to claim 1, wherein the adapter component further comprises an adapter circuit board, and the pluggable connector is disposed on the adapter circuit board and is connected with the flexible printed circuit board through the adapter circuit board.

3. The display module according to claim 2, wherein the adapter circuit board is disposed on a side of the heat dissipation component away from the driving backboard, and the pluggable connector is disposed on a side of the adapter circuit board away from the heat dissipation component.

4. The display module according to claim 1, wherein the flexible printed circuit board is disposed on a side of the underlaying substrate away from the driving circuit.

5. The display module according to claim 4, wherein a side edge of the underlaying substrate is provided with a signal lead connecting the flexible printed circuit board with the driving circuit.

6. The display module according to claim 1, wherein the underlaying substrate is a glass substrate.

7. The display module according to claim 1, wherein the heat dissipation component comprises a heat dissipation plate, a heat dissipation channel provided on the heat dissipation plate, and coolant accommodated in the heat dissipation channel, wherein the coolant is configured to dissipate heat from the driving backboard.

8. The display module according to claim 7, wherein the heat dissipation channel is a closed channel.

9. The display module according to claim 7, wherein the heat dissipation plate is at least partially in contact with the driving backboard.

10. The display module according to claim 7, wherein the heat dissipation channel comprises a main heat dissipation channel and sub heat dissipation channels disposed crosswise on at least one side of the main heat dissipation channel, wherein the sub heat dissipation channels are communicated with the main heat dissipation channel.

11. The display module according to claim 7, wherein the heat dissipation component is bonded with the driving backboard.

12. The display module according to claim 1, further comprising a light emitting unit connected with the driving backboard.

13. A spiced display device, comprising a housing and at least one display module disposed on the housing, wherein
the display module comprises a driving backboard and a heat dissipation component, wherein the driving backboard comprises an underlaying substrate and a driving circuit disposed on the underlaying substrate, the underlaying substrate is provided with a flexible printed circuit board connected with the driving circuit, and the heat dissipation component is provided with an adapter component connected with the flexible printed circuit board, and the adapter component comprises a pluggable connector; and the housing is provided with a signal joint, wherein the pluggable connector in the display module is plugged in the signal joint.

14. The tiled display device according to claim 13, wherein the display module is magnetically connected with the housing.

15. The tiled display device according to claim 13, wherein the adapter component further comprises an adapter circuit board, and the pluggable connector is disposed on the adapter circuit board and is connected with the flexible printed circuit board through the adapter circuit board.

16. The tiled display device according to claim 13, wherein the flexible printed circuit board is disposed on a side of the underlaying substrate away from the driving circuit.

17. The tiled display device according to claim 13, wherein the underlaying substrate is a glass substrate.

18. The tiled display device according to claim 13, wherein the heat dissipation component comprises a heat dissipation plate, a heat dissipation channel provided on the heat dissipation plate, and coolant accommodated in the heat dissipation channel, wherein the coolant is used for dissipating heat from the driving backboard.

19. The tiled display device according to claim 13, wherein the display module further comprises a light emitting unit connected with the driving backboard.

* * * * *